United States Patent

Andersson et al.

[15] 3,649,738

[45] Mar. 14, 1972

[54] SEMICONDUCTOR DEVICE

[72] Inventors: Nils Eric Andersson; Tibor Farkas, both of Vasteras, Sweden

[73] Assignee: Allmanna Svenska Elektriska Aktiebolaget, Vasteras, Sweden

[22] Filed: Feb. 16, 1971

[21] Appl. No.: 115,289

[30] Foreign Application Priority Data

Mar. 5, 1970 Sweden ..................................2909/70

[52] U.S. Cl. ......................174/15 R, 174/DIG. 5, 317/234 A
[51] Int. Cl. ...........................................................H01l 1/12
[58] Field of Search .............174/15 R, 16 R, DIG. 5, DIG. 3; 317/234 A

[56] References Cited

UNITED STATES PATENTS

| | | | |
|---|---|---|---|
| 3,400,543 | 9/1968 | Ross | 174/15 R X |
| 3,581,163 | 5/1971 | Erikson | 317/234 A UX |
| 3,226,466 | 12/1965 | Martin | 174/15 R |
| 2,958,021 | 10/1960 | Cornelison et al. | 174/15 R UX |
| 2,780,759 | 2/1957 | Boyer et al. | 174/15 R UX |

*Primary Examiner*—Laramie E. Askin
*Assistant Examiner*—A. T. Grimley
*Attorney*—Jennings Bailey, Jr.

[57] ABSTRACT

A semiconductor system including a semiconductor wafer is provided on at least one side with cooling means formed of a container having a movable wall facing the semiconductor system into which a cooling fluid is fed in such a way as to maintain a substantial pressure in the container to press the movable wall against the semiconductor device.

9 Claims, 4 Drawing Figures

INVENTOR.
NILS ERIC ANDERSSON
BY TIBOR FARKAS
Jennings Bailey, Jr.

SEMICONDUCTOR DEVICE

BACKGROUND OF THE INVENTION

1. Field of the Invention

The invention relates to a cooling arrangement for semiconductor devices.

2. The Prior Art

Semiconductor devices usually comprise a semiconductor system consisting of a semiconductor wafer, for example of silicon or germanium, and most often of at least one support plate, for example of molybdenum, for the semiconductor wafer. The semiconductor system is arranged between two connection bodies for electric current. The connection bodies may be soldered to the semiconductor system. They may also be held in contact with the semiconductor system solely by being pressed against it. In the latter case, therefore, there is no layer of solder between the connection bodies and the semiconductor system. The semiconductor system is usually cooled, at least on one side, to conduct the power loss in the semiconductor wafer.

For semiconductor devices having connection bodies soldered to the semiconductor system it is known to carry out the cooling with a flowing liquid coolant which is brought into contact with a connecting body.

It is a problem with semiconductor systems which are held pressed between the connection bodies to effect uniform loading of the semiconductor system. Uniform loading is extremely important in order to produce good electric and thermal contact between the connection body and the system along the whole surface of the semiconductor system and also to effect uniform mechanical loading over the whole surface of the semiconductor system. Uneven loading may lead to the formation of cracks in the brittle semiconductor wafer.

SUMMARY OF THE INVENTION

According to the invention an extremely effective removal of the power losses in the semiconductor system and extremely uniform mechanical loading of the semiconductor system is obtained along the whole surface of the system.

The present invention relates to a semiconductor device, for example a transistor, a thyristor or a crystal diode comprising a semiconductor system, wafer-shaped and comprising a semiconductor wafer which at least on one side is arranged to be cooled by a liquid or gaseous coolant, characterized in that the coolant is arranged in a container having a movable wall facing the semiconductor system, and that the coolant is arranged to keep the movable wall pressed against the semiconductor system and thus effect efficient electric and thermal contact between the movable wall and the semiconductor system.

The movable wall consists of a metallic material having good electric and thermal conductivity such as copper, silver, gold, aluminum, brass, nickel, molybdenum or alloys containing one or more of these metals. Copper, silver and aluminum and alloys containing these metals, such as for example zirconium-copper (Zr 0.10–0.30 percent, Cu remainder), chromium-copper (Cr 0.2–1 percent, Cu remainder) silver-copper (Ag 0.08 percent, Cu remainder), silumin (12 percent Si, 88 percent Al) and duralumin (0.5 percent Mn, 0.5 percent Mg, 4 percent Cu and 95 percent Al) are particularly preferred.

The movable wall may be movable because the other walls of the container are movable or extensible. The latter may be, for example, in the form of a bellows which is extensible in the direction of the semiconductor system. The movable wall facing the semiconductor system need not then be especially thin. It may, for example, have a thickness of up to 5 mm. However, it is an advantage if it is thin, preferably 0.05–1 mm., and yielding as it can then be more effectively made to fit the surface of the semiconductor system.

The movable wall may also be movable merely because it is itself movable, that is the other walls of the container are fixed. In this case the movable wall consists of a thin membrane which is yielding in relation to the semiconductor system and can fit itself to its surface. The thickness of the movable wall is then suitably 0.05–2 mm., preferably 0.05–1 mm.

The coolant may be a liquid such as water or oil, or a gas, such as air. The pressure in the coolant is suitably 10–500 kgf./cm.$^2$ and preferably 50–500 kgf./cm.$^2$. The coolant is conducted preferably continuously through the container, but may also be supplied and conducted away intermittently.

Besides the semiconductor wafer of, for example, silicon or germanium, the semiconductor system may comprise at least one support plate of molybdenum, tungsten or other material having approximately the same coefficient of thermal expansion as the semiconductor system, arranged on one side of the semiconductor wafer. However, besides the semiconductor wafer, the semiconductor system may consist only of thin metal layers arranged on one or both sides of the semiconductor wafer and applied by means of vaporization or cathode sputtering or by electrolytic coating. The metal layers may be formed in connection with doping the semiconductor wafer or in a separate process afterwards. As examples of metals in the layers may be mentioned, gold, silver, copper, aluminum, nickel, lead, indium and alloys containing one of these metals. The semiconductor system may also consist only of the semiconductor wafer, in which case it is suitable to use a semiconductor wafer having highly doped surface layers.

The semiconductor device according to the invention may be cooled only from one side or from both sides.

The movable wall may abut directly against the semiconductor system without intermediate parts of a casing for conventional hermetical sealing of the semiconductor system. An especially good electric and thermal contact is thus obtained between the semiconductor system and the movable wall.

Because of the uniform loading on the semiconductor which is achieved according to the invention, the invention is extremely suitable for use in semiconductor systems having no support plates. By avoiding the use of support plates between the semiconductor wafer and the movable wall, extremely good contact is achieved between the semiconductor wafer and the movable wall. In this case the semiconductor system consists only of the semiconductor wafer with thin metal layers arranged on the surface such as the thin surface layers formed when alloying doping metals, for example gold-antimony alloys and aluminum or when diffusing in doping metals, for example arsenic and gallium.

BRIEF DESCRIPTION OF THE DRAWINGS

The invention will be explained by describing embodiments of the invention with reference to the accompanying drawings in which.

DESCRIPTION OF THE PREFERRED EMBODIMENTS

Figure 1:
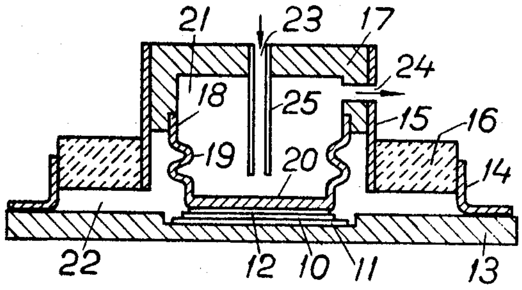
FIG. 1 shows in cross section a semiconductor device according to the invention cooled on one side only.

In the semiconductor device according to FIG. 1 a circular silicon wafer 10 of P—N—N+ type is soldered on the lower side with a layer of aluminum solder, not shown, to a support plate 11 or molybdenum or other material having approximately the same coefficient of thermal expansion as silicon and provided on the upper side with an alloyed gold-antimony contact in the form of a layer 12. The semiconductor system consisting of the elements 10, 11 and 12 is hermetically sealed in a casing comprising a baseplate 13 of, for example, copper which also serves as connecting body, and a lidlike part consisting of two rings 14 and 15 of metal, for example copper or iron-nickel alloy, a ring 16 of insulating material, for example porcelain, and a lid 17 of metal, for example copper or steel. To the lid 17 is attached a cuplike part 18 which is provided with a bellows 19 of, for example, copper or stainless steel, so that its bottom 20 is movable in a vertical direction and can be pressed against the semiconductor system. The lid 17 and the cuplike part 18 form together a container with a space 21 which is closed to the space 22 located outside the part 18 inside the sealed casing. The bottom 20, that is the wall of the container movable towards the semiconductor system, has a thickness of 1.5 mm. The cuplike part, which also acts as connection body, has otherwise a wall thickness of 0.5 mm. The space 21 is provided with an opening 23 for supply and an opening 24 for removal of a liquid, for example oil or water, which circulates through the space 21 to cool the semiconductor wafer 10 and to press the bottom 20 against the semiconductor system. The liquid pressure in the container is 150 kgf./cm$^2$. The liquid is led into the space 21 towards the central part of the bottom through the pipe 25. The various parts of the semiconductor devices are attached to each other conventionally by means of soldering, welding or cold-press welding. The semiconductor system 10, 11, 12 is not fixed to the base 13 or the bottom 20 by soldering or the like, but is kept in contact with these bodies solely by the bottom being pressed against the semiconductor system by the coolant. The current is connected to parts 13 and 17.

Figure 2:
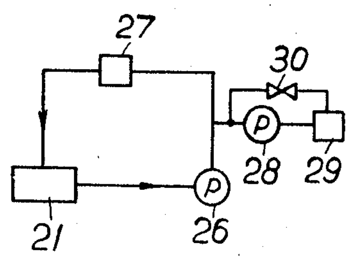
FIG. 2 shows schematically a circulation circuit for the coolant to a semiconductor device according to the invention and FIGS. 3 and 4 in cross section show semiconductor devices according to the invention cooled on both sides.

As can be seen in FIG. 2, the liquid circulation circuit outside the semiconductor device also includes a circulation pump 26, for example a vane pump or a toothed gear pump and a heat-exchanger 27 to cool the oil. In order to maintain the pressure a compression pump 28, for example a screw pump, a piston pump, a vane pump or a toothed gear pump, is connected in a special circuit. Furthermore, in the latter circuit there is a liquid store 29 to compensate for any liquid which may leak out of the system, this being connected to the circulation circuit. The compression pump is connected in parallel with an overflow valve 30 to control the pressure in the system. FIG. 2 shows only the container for the coolant from the semiconductor device according to FIG. 1, that is the corresponding parts 17 and 18 with the space 21 which they enclose. Other parts of the semiconductor device according to FIG. 1 are thus not illustrated in FIG. 2.

Figure 3:
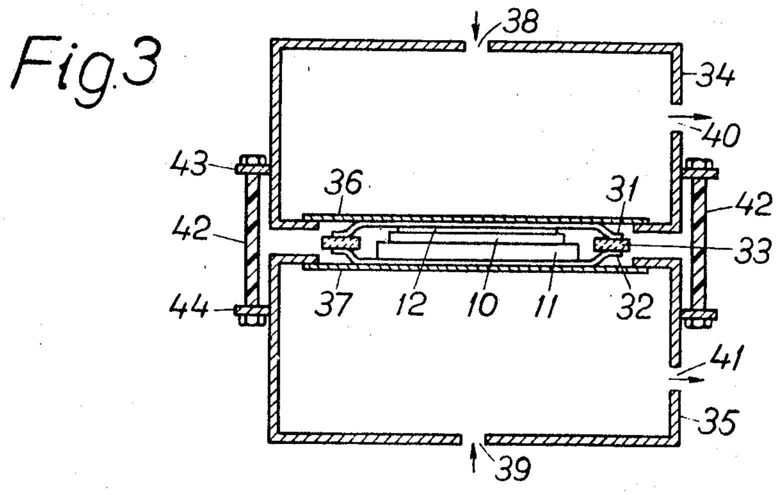

In the arrangement according to FIG. 3, the semiconductor system is of the same type as that in FIG. 1. It is enclosed hermetically in a casing comprising two thin wafers 31 and 32 of metal such as copper or iron-nickel alloy, which are soldered to a ring 33 of insulating material, for example porcelain, with copper-silver solder. On both sides of the semiconductor system are cylindrical containers 34 and 35 for coolant, these being of steel for example. They have bottoms 36 and 37 in the form of thin membrances of copper which are soldered to the steel container with copper-silver solder. The wall thickness of the membranes is 0.5 mm. The coolant, water, oil or air, is led in through openings 38 and 39 and out through openings 40 and 41. The pressure in the coolant is 150 kgf./cm$^2$. Circulation circuits for the coolant according to FIG. 2 may be used. The two containers are held at the correct distance from each other by a number of bolts 42 of insulating material in flanges 43 and 44 around the containers. The contact between the semiconductor system and the membranes 36 and 37 is effected solely by the pressure of the coolant. The current can be connected to the containers 34 and 35 or to special connection conductors of copper which are joined to the membrances 36 and 37.

Figure 4:
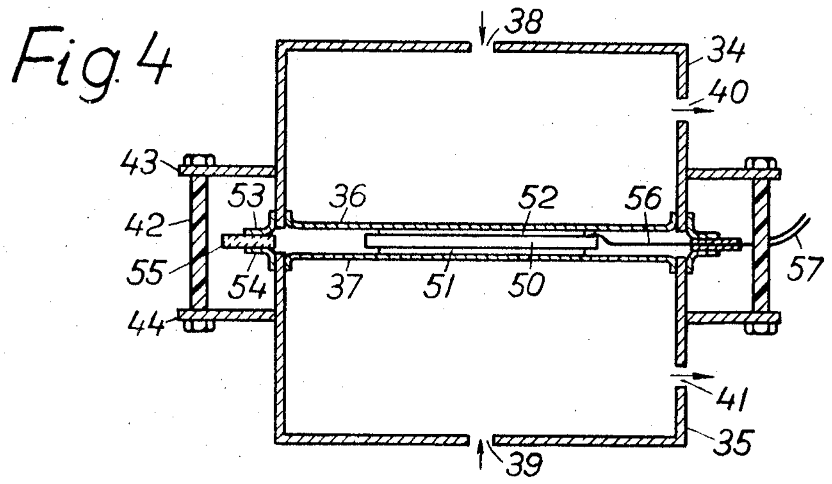

In the semiconductor system according to FIG. 4 the semiconductor wafer consists of a silicon wafer 50 of PNPN type. On one side it has an aluminum contact alloyed in in the form of a thin layer 51 and on the other side a gold-antimony contact alloyed in in the form of a thin layer 52. The containers 34 and 35 with the bottoms 36 and 37 in the form of membranes, as well as the openings 38 and 39, 40 and 41 are of the same kind as those in FIG. 3. The membranes which may have a thickness of 0.2 mm. in this case abut directly against the contacts 51 and 52 of the semiconductor wafer without intermediate support plates. The thin membranes in combination with the liquid pressure or gas pressure enable the semiconductor wafer to be used without support plates since the risk of the semiconductor wafer breaking as a result of uneven loading is minimal. The semiconductor wafer is hermetically sealed since the containers are provided with flanges 53 and 54 around their sheath surfaces and these are attached to the porcelain ring 55 by means of, for example, copper-silver solder. The coolant such as water or oil can circulate in accordance with FIG. 2. The water pressure may be 150 kgf./cm$^2$. The flanges and bolts of insulating material for fixing the containers in their proper places in relation to each other are designated in the same way as in FIG. 3. The control electrode 56 of the thyristor is drawn through a hole in the porcelain ring, the gap around the control electrode being hermetically sealed, and connected to a connection conductor 57. The main current can be connected in the manner described for the arrangement according to FIG. 3.

We claim:

1. Semiconductor device comprising a wafer-shaped semiconductor system and comprising a semiconductor wafer, and means for cooling the semiconductor wafer at least on one side by a fluid coolant, which comprises a container having a movable wall facing the semiconductor system, and means to supply coolant to the container under pressure to keep the movable wall pressed against the semiconductor system and thus effect efficient electric and thermal contact between the movable wall and the semiconductor system.

2. Semiconductor device according to claim 1, comprising a second container on the other side of the semiconductor system, said second container having a wall, movable towards and facing the semiconductor system, and means to supply coolant to the second container under pressure to keep its movable wall pressed against the second side of the semiconductor system and thus effect an efficient electric and thermal contact between this movable wall and the second side of the semiconductor system.

3. Semiconductor system according to claim 1, in which the movable wall consists of a thin membrane of metallic material.

4. Semiconductor device according to claim 1, in which the movable wall abuts directly against the semiconductor system.

5. Semiconductor device according to claim 1, in which the semiconductor system is constructed without support plates.

6. Semiconductor device according to claim 1, in which the pressure in the coolant is 10–500 kg./cm$^2$.

7. Semiconductor device according to claim 1, in which the coolant is led continuously through the container.

8. Semiconductor device according to claim 1, in which the coolant is water or oil.

9. Semiconductor device according to claim 1, in which the coolant is air.

* * * * *